(12) United States Patent
Lee et al.

(10) Patent No.: US 10,748,593 B2
(45) Date of Patent: Aug. 18, 2020

(54) UNIPOLAR SWITCHING OF MAGNETIC MEMORY

(71) Applicant: National University of Singapore, Singapore (SG)

(72) Inventors: Jongmin Lee, Singapore (SG); Hyunsoo Yang, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 16/356,889

(22) Filed: Mar. 18, 2019

(65) Prior Publication Data
US 2019/0295620 A1  Sep. 26, 2019

(30) Foreign Application Priority Data

Mar. 21, 2018  (SG) .......................... 10201802320V

(51) Int. Cl.
*G11C 11/16* (2006.01)
*H01L 43/12* (2006.01)
(Continued)

(52) U.S. Cl.
CPC .......... *G11C 11/161* (2013.01); *H01L 27/224* (2013.01); *H01L 43/02* (2013.01); *H01L 43/08* (2013.01); *H01L 43/12* (2013.01)

(58) Field of Classification Search
CPC . H01L 27/222; H01L 27/11293; H01L 29/82; H01L 43/02; G11C 14/0036;
(Continued)

(56) References Cited

U.S. PATENT DOCUMENTS 7,933,146 B2  4/2011  Dimitrov et al.
9,036,407 B2  5/2015  Wang et al.
(Continued)

FOREIGN PATENT DOCUMENTS

WO  WO-2016021468 A1  2/2016

OTHER PUBLICATIONS

Dorrance, Richard, et al., "Diode-MTJ Crossbar Memory Cell Using Voltage-Induced Unipolar Switching for High-Density MRAM," IEEE, IEEE Electron Device Letters, vol. 34, No. 6, Jun. 2013, pp. 753-755.
(Continued)

*Primary Examiner* — Hsien Ming Lee
(74) *Attorney, Agent, or Firm* — Cesari and McKenna, LLP; James A. Blanchette

(57) ABSTRACT

In various embodiments, techniques are provided for unipolar SOT switching of a magnetic memory, using current pulses with differing pulse durations or current densities. For example, to switch a MTJ to a high resistance state, in-plane current pulses having a first pulse duration may be applied. To switch the MTJ to a low resistance state, in-plane current pulses having a second pulse duration may be applied. The pulse's polarity and current density may be fixed, and the polarity and magnitude of an in-plane assist field may be fixed. Alternatively, to switch a MTJ to a high resistance state in-plane current pulses having a first current density may be applied. To switch the MTJ to a low resistance state in-plane current pulses having a second current density may be applied. The pulse's polarity and duration may be fixed, and the polarity and magnitude of an in-plane assist field may be fixed.

20 Claims, 20 Drawing Sheets

(51) Int. Cl.
*H01L 27/22* (2006.01)
*H01L 43/02* (2006.01)
*H01L 43/08* (2006.01)

(58) Field of Classification Search
CPC . G11C 14/0045; G11C 14/0081; G11C 19/02; H01F 10/329; H03B 15/006
See application file for complete search history.

(56) References Cited

U.S. PATENT DOCUMENTS

| | | |
|---|---|---|
| 9,236,565 B2 | 1/2016 | Loong et al. |
| 9,502,092 B2 | 11/2016 | Zhou et al. |
| 9,716,220 B2 | 7/2017 | Wu et al. |
| 9,741,414 B2 | 8/2017 | Qiu et al. |
| 9,997,226 B2 | 6/2018 | Qiu et al. |
| 10,115,443 B2 * | 10/2018 | Yoon .................... G11C 11/165 |
| 2015/0129995 A1 | 5/2015 | Wang et al. |
| 2019/0058113 A1 | 2/2019 | Ramaswamy et al. |

OTHER PUBLICATIONS

Hung, Yu-Ming, et al., "Quasistatic and Pulsed Current-Induced Switching With Spin-Orbit Torques in Ultrathin Films With Perpendicular Magnetic Anisotropy," IEEE, IEEE Magnetics Letters, Spin Electronics, vol. 6, Aug. 7, 2015, pp. 1-4.

Legrand, William, et al., "Coherent Sub-Nanosecond Switching of Perpendicular Magnetization by the Field-like Spin-Orbit Torque Without an External Magnetic Field," Physical Review Applied, May 2015, pp. 1-31.

U.S. Appl. No. 16/265,451, filed Feb. 1, 2019 by Jongmin Lee, et al. for Magnetic Memory and a Method of Operating Magnetic Memory, pp. 1-28.

\* cited by examiner

UNIPOLAR SWITCHING OF MAGNETIC MEMORY

RELATED APPLICATIONS

The present application claims priority to Singapore Patent Application No. 10201802320V, titled "Unipolar Switching of Magnetic Memory", filed by Applicant National University of Singapore on Mar. 21, 2018, the contents of which are incorporated by reference herein in their entirety.

BACKGROUND

Technical Field

The present disclosure relates generally to magnetic memory, such as magnetic random access memory (MRAM), and more specifically to techniques for switching magnetic memory.

Background Information

Magnetic memory, such as MRAM, is a memory technology which is capable of providing fast response (i.e. read and write) times. In contrast to conventional memory technologies that use electric charge or current flow to store data, magnetic memory uses magnetic elements. The data stored by such magnetic elements typically does not degrade over time, providing magnetic memory with non-volatile characteristics. Further, magnetic memory typically consumes less power than other memory technologies.

Magnetic memory is generally composed of a magnetic tunnel junction (MTJ) and electrical current lines. The MTJ typically includes a free magnetic layer, a tunneling barrier oxide layer, and a reference magnetic layer. Data are stored utilizing the relative alignment of the magnetization of the two magnetic layers (i.e. the relative alignment of the free magnetic layer and the reference magnetic layer). Electrical resistance of the MTJ is low when there is a parallel alignment between the magnetization of the two magnetic layers, defining a low resistance state, and is high when there is an anti-parallel alignment between the magnetization of the two magnetic layers, defining a high resistance state. Binary data can be written by switching the electrical resistance states. For example, the high resistance state can represent "1" and the low resistance state can represent "0." Stored data can be read out by measuring the electrical resistance state.

The two relative alignments of magnetization (i.e. parallel and anti-parallel) are typically achieved by switching the direction of the free magnetic layer with respect to that of the reference magnetic layer. Current flow through the MTJ may be used to switch the direction of the free magnetic layer. This mechanism is called spin-transfer-torque (STT). In STT, the current used for both read and write operations flows though the MTJ. As the read and write current paths are shared, the read current can unintentionally switch the direction of the free magnetic layer, this condition being commonly referred to as a "read disturbance" or simply "read disturb". The magnitude of current required to switch the free layer tends to decrease as the MTJ scales down to a smaller size. However, high-speed read operations typically require more read current. Therefore, high speed operation of deeply scaled magnetic memory may be subject to significant numbers of read disturbances.

More recently, another mechanism commonly referred to as spin-orbit-torque (SOT) has been introduced that utilizes in-plane current flow for writing. In SOT, only the read current typically flows though the MTJ. Thus, a SOT based magnetic memory may be free from the issue of "read disturbance" and has other desirable characteristics. Despite these characteristics, however, existing SOT based magnetic memories are not perfect.

Writing data to a magnetic memory that is either based on STT or SOT typically requires a bipolar switching operation. For example, a positive current is required to switch to the low resistance state (e.g., to write a "0") and negative current is required to switch to the high resistance state (e.g., to write a "1"). This is due to a need to reverse the current flow direction (or current polarity) to switch the free magnetic layer direction (and cause consequent electrical resistance change in the MTJ). For example, a positive current in the current channel (in a SOT based magnetic memory) or though the MTJ (in a STT based magnetic memory) is required to write the low resistance state (i.e. a parallel alignment between the free magnetic layer and reference magnetic layer). On the other hand, a negative current in the current channel (in a SOT based magnetic memory) or though the MTJ (in a STT based magnetic memory) is required to write the high resistance state (i.e. an anti-parallel alignment between the free magnetic layer and reference magnetic layer). FIG. 1 is a generalized switching diagram 100 showing bipolar currents (a positive current with current density $J_1$ and a negative current with current density $J_2$) and corresponding resistance changes (between a high resistance state $R_{high}$ and a low resistance state $R_{low}$).

Because bipolar switching is required in the writing process, devices capable of providing bipolar currents, such as transistors, are generally required in magnetic memory designs. The large size of transistors causes problems in scaling and is an obstacle for high density integration of magnetic memories. Accordingly, there is a need for improved techniques for switching magnetic memory that do not require bipolar switching, and the presence of transistors which bipolar switching typically necessitates.

SUMMARY

Techniques are provided for unipolar SOT switching of a magnetic memory, such as a MRAM, using current pulses having the same polarity but either differing pulse durations or current densities. For example, to switch a MTJ to a high resistance state, in-plane current pulses having a first pulse duration $t_1$ may be applied. To switch the MTJ to a low resistance state, in-plane current pulses having a second pulse duration $t_2$ may be applied. The pulse's polarity and current density J may be maintained fixed, and the polarity and magnitude of an in-plane assist field H may be maintained fixed. Alternatively, to switch a MTJ to a high resistance state in-plane current pulses having a first current density $J_1$ may be applied. To switch the MTJ to a low resistance state in-plane current pulses having a current density $J_2$ may be applied. The pulse's polarity and duration t may be maintained fixed, and the polarity and magnitude of an in-plane assist field H may be maintained fixed.

Unipolar switching operation may allow for diodes to replace transistors in magnetic memory designs. Among other benefits, diode-controlled magnetic memory may be capable of greater scaling and higher densities, since diodes typically can generate more current than transistors while having smaller dimensions. Further, diode-controlled magnetic memory may be suited for a crossbar architecture that can allow for efficient three-dimensional (3D) stacking of multiple layers.

In one specific example embodiment, a method is provided for unipolar SOT switching from field-like torque (FLT) of a magnetic memory having an electrical current channel in a plane adjacent to a MTJ. An in-plane assist field H having a fixed polarity and magnitude is applied. In-plane current pulses having constant current density J but different pulse durations are applied to switch the magnetic memory via SOT from FLT. An in-plane current pulse having a first pulse duration $t_1$ is applied to switch the MTJ from a high resistance state to a low resistance state. An in-plane current pulse having a second pulse duration $t_2$ is applied to switch the MTJ from the low resistance state to the high resistance state, in which the second pulse duration $t_2$ is different from the first pulse duration $t_1$.

In one another specific example embodiment, a method is provided for unipolar SOT switching of a magnetic memory having an electrical current channel in a plane adjacent to a MTJ. An in-plane assist field H having a fixed polarity and magnitude is applied. In-plane current pulses having constant pulse duration t but different current densities are applied to switch the magnetic memory via SOT from FLT. An in-plane current pulse having a first current density $J_1$ is applied to switch the MTJ from a high resistance state to a low resistance state. An in-plane current pulse having a second current density $J_2$ is applied to switch the MTJ from the low resistance state to the high resistance state, where the second current density $J_2$ is different than the first current density $J_1$.

In still another specific example embodiment, a diode-controlled magnetic memory device includes a MTJ, a current channel disposed in a plane adjacent to the MTJ, and one or more diodes configured to apply in-plane current pulses having constant current density J but different pulse durations. The one or more diodes apply an in-plane current pulse having a first pulse duration $t_1$ to switch the MTJ from a high resistance state to a low resistance state via SOT from FLT, and an in-plane current pulse having a second pulse duration $t_2$ to switch the MTJ to a low resistance state via SOT from FLT, where the second pulse duration $t_2$ is different than the first pulse duration $t_1$.

In yet another specific example embodiment, a diode-controlled magnetic memory device includes a MTJ, a current channel disposed in a plane adjacent to the MTJ, and one or more diodes configured to apply in-plane current pulses having differing current densities but the same pulse duration t. The one or more diodes apply an in-plane current pulse having a first current density $J_1$ to switch the MTJ from a high resistance state to a low resistance state via SOT from FLT, and an in-plane current pulse having a second current density $J_2$ to switch the MTJ from the low resistance state to the high resistance state via SOT from FLT, where the second current density duration $J_2$ is different than the first current density $J_1$.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION OF EXAMPLE EMBODIMENTS

An Example SOT Device

Figure 2:
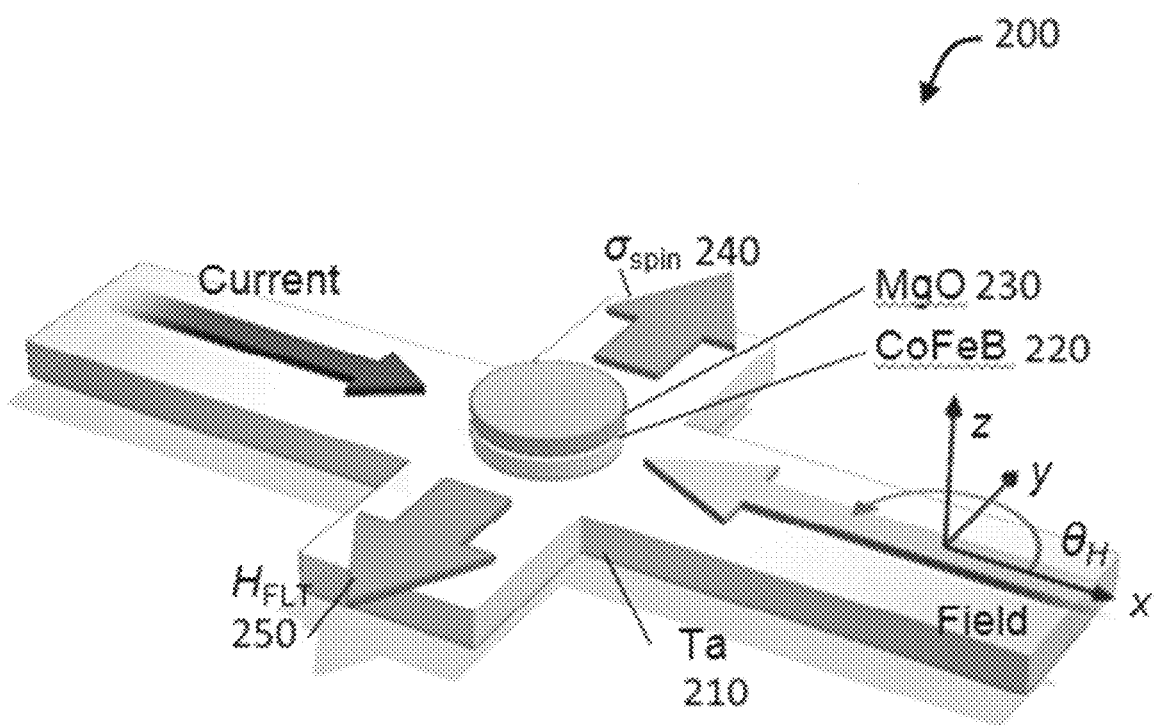
FIG. 2 is a schematic diagram of an example SOT device illustrative of one that may be used in a diode-controlled magnetic memory, such as a diode-controlled MRAM.

FIG. 2 is a schematic diagram of an example SOT device 200 illustrative of one that may be used in a diode-controlled magnetic memory, such as a diode-controlled MRAM. The SOT device 200 is structured with a layer stack that includes a heavy metal (HM) layer 210 of tantalum (Ta) of 6 nanometers (nm), a ferromagnetic (FM) layer 220 of cobalt-iron-boron alloy (CoFeB such as $Co_{40}Fe_{40}B_{20}$) of 0.9 nm, a metal oxide layer 230 of magnesium oxide (MgO) of 2.0 nm, and a capping layer (not shown) of silicon oxide ($SiO_2$) of 3.0 nm on top of a silicone/silicon oxide ($Si/SiO_2$) substrate (not shown). Such a layer stack may be prepared, for example, by magnetron sputtering and annealing. The Ta may be patterned as a Hall cross with an in-plane current channel, along the +x-axis and the CoFeB may be patterned as a 1000 nm diameter (d) circular dot with perpendicular magnetic anisotropy on top of the Hall cross providing a MTJ (not shown) adjacent to the current channel. The patterning may be performed, for example, using electron beam lithography and argon (Ar) ion etching. Electrodes may be prepared using Ta of 5 nm and of Cu of 100 nm. The in-plane current channel surface may be cleaned using Ar ion etching prior to electrode deposition for Ohmic contacts. The thickness of the current channel after fabrication may be 3.5 nm. The layers may have a saturation magnetization $M_s$ of approximately 670 electromagnetic units/cubic centimeters ($emu/cm^3$) and an effective anisotropy field $H_{k,eff}$ of approximately 2990 Oe, in one specific implementation.

In operation, direct current (DC) and current pulses are injected on the in-plane current channel, along the +x-axis. When implemented in a magnetic memory, the current pulses may be provided by one or more diodes (not shown). An in-plane assist-field (H) is applied in the xy plane where the in-plane angle $\theta_H$ is defined with respect to the +x-axis. In this example, the applied H is along the −x-axis ($\theta_H=180°$).

SOT Induced Oscillatory Switching Behavior

Unipolar SOT switching may be achieved by taking advantage of unexpected oscillatory switching behavior in a SOT device, such as the one shown in FIG. 2. In general SOT is compose of two components, namely, the damping-like torque (DLT), $\tau_{DLT} \sim \hat{m} \times (\hat{m} \times \hat{y})$ and the FLT, $\tau_{FLT} \sim \hat{m} \times \hat{y}$, where $\hat{m}$ and $\hat{y}$ indicate the direction of the magnetization and the spin polarization of the incoming spin current, respectively. When substantial magnetization is orthogonal to $\hat{y}$, the DLT and FLT can be considered an equivalent field with $\hat{m} \times \hat{y}$, symmetry ($H_{DLT}$) and $\hat{y}$ symmetry ($H_{FLT}$), respectively. Referring to FIG. 2, spin polarization 240 and FLT equivalent $H_{FLT}$ 250 may be disposed as shown.

DLT successfully explains deterministic SOT switching in magnetic structures with perpendicular anisotropy, as its $\hat{m} \times \hat{y}$, symmetry can break the $\hat{z}$-symmetry in potential wells, which are in an out-of-plane direction. Meanwhile, FLT was previously thought to affect the switching current density but by itself does not to play a key role in deciding the switching direction due to its $\hat{y}$-symmetry. In contrast to conventional thinking, it has been determined that FLT also plays an important role in deterministic switching, and that this role may be utilized to permit unipolar SOT switching.

Referring back to FIG. 2, oscillatory switching behavior may be demonstrated in testing by applying DC and nano-second current pulses in the Ta current channel through a bias-tee, and measuring perpendicular magnetization state from the anomalous Hall resistance. In a specific testing example, a low DC current of +70 µA and a pulsed-current having a rising time of ~70 ps and a falling time of ~80 ps may be used. The magnitude of the current pulse may be determined by measuring the transmitted signal. The switching probability under pulsed-currents may be obtained from applying a negative reset DC current of 1.5 mA to initialize the magnetization to an "up" magnetization configuration followed by a positive pulsed-current for SOT switching. A few seconds after each current pulse, the anomalous Hall resistance may be measured using a low DC current of +70 µA to sense the magnetization state. Individual pulsed-current injections with a fixed current density J and duration t may be repeated to determine the switching probability $P_{sw}$ that is equal to a number of "down" states divided by a number of trials.

Figure 3:
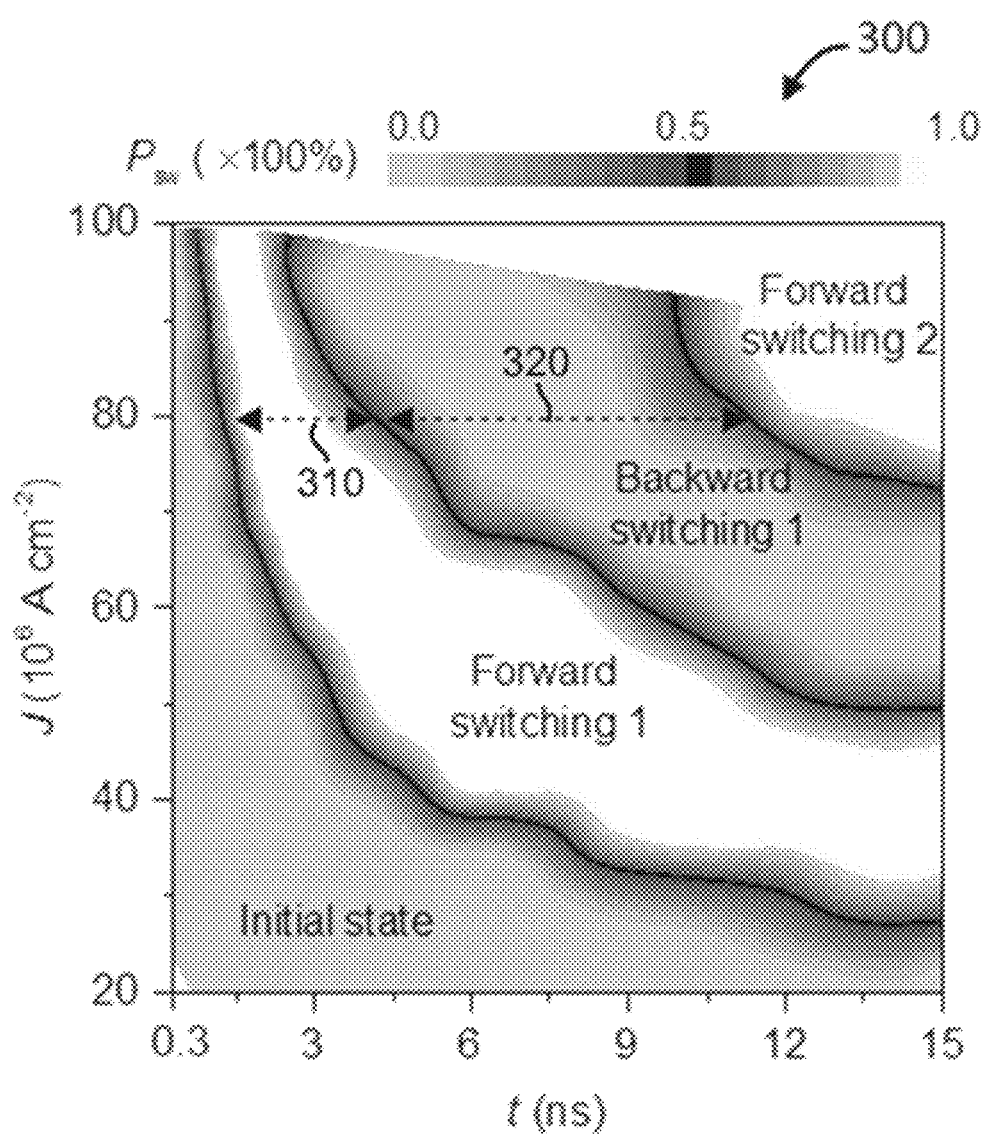
FIG. 3 is a switching probability diagram for the example SOT device of FIG. 2 showing switching probability $P_{sw}$ as a function of current density J and pulse duration t at a fixed in-plane assist field H.

FIG. 3 is a switching probability diagram 300 for the example SOT device 200 of FIG. 2 showing switching probability $P_{sw}$ as a function of current density J and pulse duration t at a fixed in-plane assist field H of 1161 Oe. The SOT device 200 has an initial "up" magnetization configuration. The forward and backward switching indicates "up" to "down" and "down" to "up" magnetization switching, respectively. The dashed arrows 310, 320 indicate the periods of forward switching and backward switching for an applied J of $79.4 \times 10^6$ A $cm^{-2}$, respectively.

Figure 4:
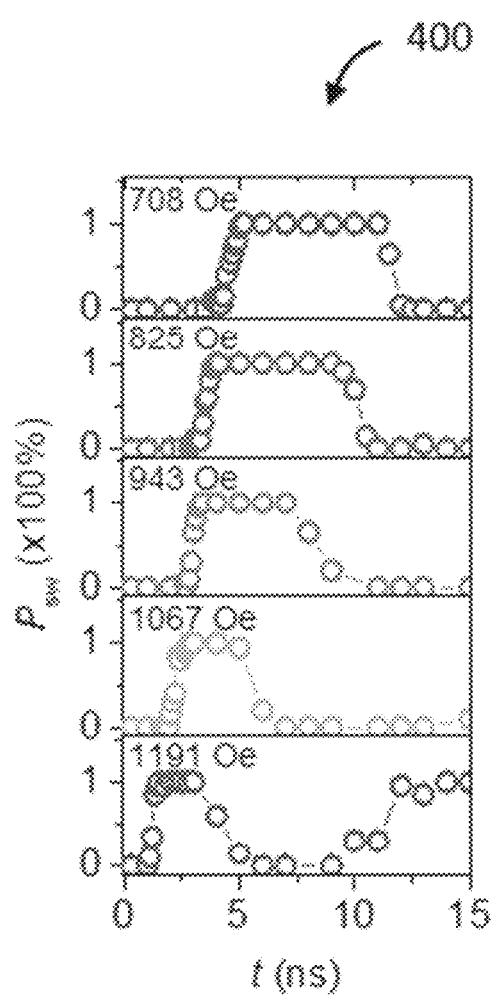
FIG. 4 is a graph of switching probability $P_{sw}$ as a function of pulse duration t with varying in-plane assist field H.

FIG. 4 is a graph 400 of switching probability $P_{sw}$ as a function of pulse duration t with varying in-plane assist field H. Current density J and in-plane angle $\theta_H$ are kept fixed to $+79.4 \times 10^6$ A $cm^{-2}$ and 180°, respectively. Under the application of the current pulses, a clear "up" to "down" SOT switching is observed as indicated by the transition of $P_{sw}$ from 0% to 100%. This first switching boundary (the points where switching probability $P_{sw}$ is equal to 50%) between initial state and forward switching is monotonic with respect to current density J, pulse duration t and in-plane assist field H, suggesting that the forward switching is more likely to occur with a larger current density J, a longer pulse duration t or a larger in-plane assist field H, which is expected from torque driven SOT magnetization switching dynamics. Moreover, the "up" to "down" switching is also consistent with DC current induced SOT switching. By performing a linear fit of the critical switching current density ($J_c$ equal to J at the first switching boundary) with corresponding values of 1/t, intrinsic critical switching current density $J_{c0}$ in the example SOT device of FIG. 2 may be estimated as $43.2 \times 10^6$ A $cm^{-2}$. This value of $J_{c0}$ is significantly smaller than the calculated value of $190 \times 10^6$ A $cm^{-2}$ that would be predicted by a macrospin-like coherent switching model, suggesting that the switching in the example SOT device occurs via expansion of reversed domain rather than coherent magnetization rotation.

An unexpected feature is that the magnetization flips back to its initial state with further increasing pulse duration t after the forward switching. Beyond the first switching boundary, the switching probability $P_{sw}$ would be expected under conventional thinking to remain at 100% and not switch back, since conventional think is that DLT driven incoherent SOT switching is a deterministic process. On the contrary, as seen in FIGS. 3 and 4, with the example SOT device of FIG. 2 with a longer pulse duration t, a backward switching boundary appears where the magnetization flips back from "down" to its initial "up" state. This unexpected backward switching, for a wide range of current density J, pulse duration t, and in-plane assist field H, is also a spin torque driven process, since the backward switching boundary also shows a monotonic behavior with current density J, pulse duration t, and in-plane assist field H. On applying a longer pulse duration t beyond the backward switching, the magnetization undergoes forward switching again (from "up" to "down" magnetization configuration) resulting in an oscillatory behavior of $P_{sw}$.

The occurrence of oscillatory $P_{sw}$ is unexpected because SOT switching in the example SOT device of FIG. 2 proceeds by domain expansion, rather than coherent magnetization rotation, which was typically thought to produce the switching in similar devices. The signature of incoherent switching in example SOT device of FIG. 2 can also be observed in the oscillatory period of $P_{sw}$. In the case of coherent switching, the oscillatory period of $P_{sw}$ is quite symmetric as it arises from the processional motion with constant frequency (~ Larmor frequency). On the other hand, observed periods for the example SOT device of FIG. 2 are distinctly asymmetric, with the observed period for the backward switching being much longer than that for the first forward switching. For instance, the periods of the first forward switching and backward switching may be approximately 2.7 ns and 7.5 ns, respectively, for an applied current density J of $79.4 \times 10^6$ A cm$^{-2}$ and in-plane assist field H of 1191 Oe, which are indicated by dashed arrows 310, 320 in FIG. 3.

Deterministic Unipolar SOT Switching

Utilizing the unexpected oscillatory switching behavior discussed above, methods for unipolar SOT switching have been developed that utilize in-plane current pulses of differing pulse duration t, while maintaining current density J constant, and the polarity and magnitude of an in-plane assist field H fixed. Further, methods for unipolar SOT switching have been developed that utilize in-plane current pulses of differing current density (magnitude) J, while maintaining pulse duration t constant, and the polarity and magnitude of an in-plane assist field H fixed.

Figure 1:
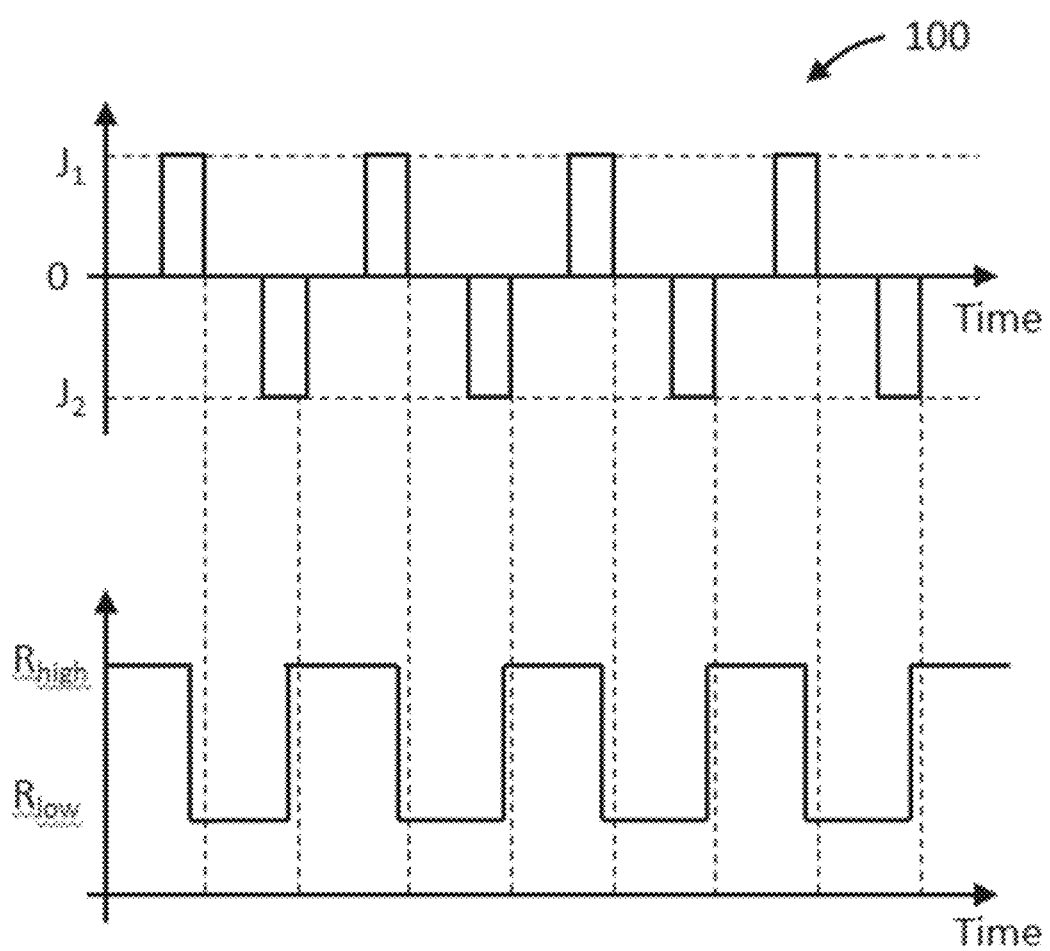
FIG. 1 is a generalized switching diagram showing bipolar currents (a positive current with current density $J_1$ and a negative current with current density $J_2$) and corresponding resistance changes (between a high resistance state $R_{high}$ and a low resistance state $R_{low}$)
Figure 5A:
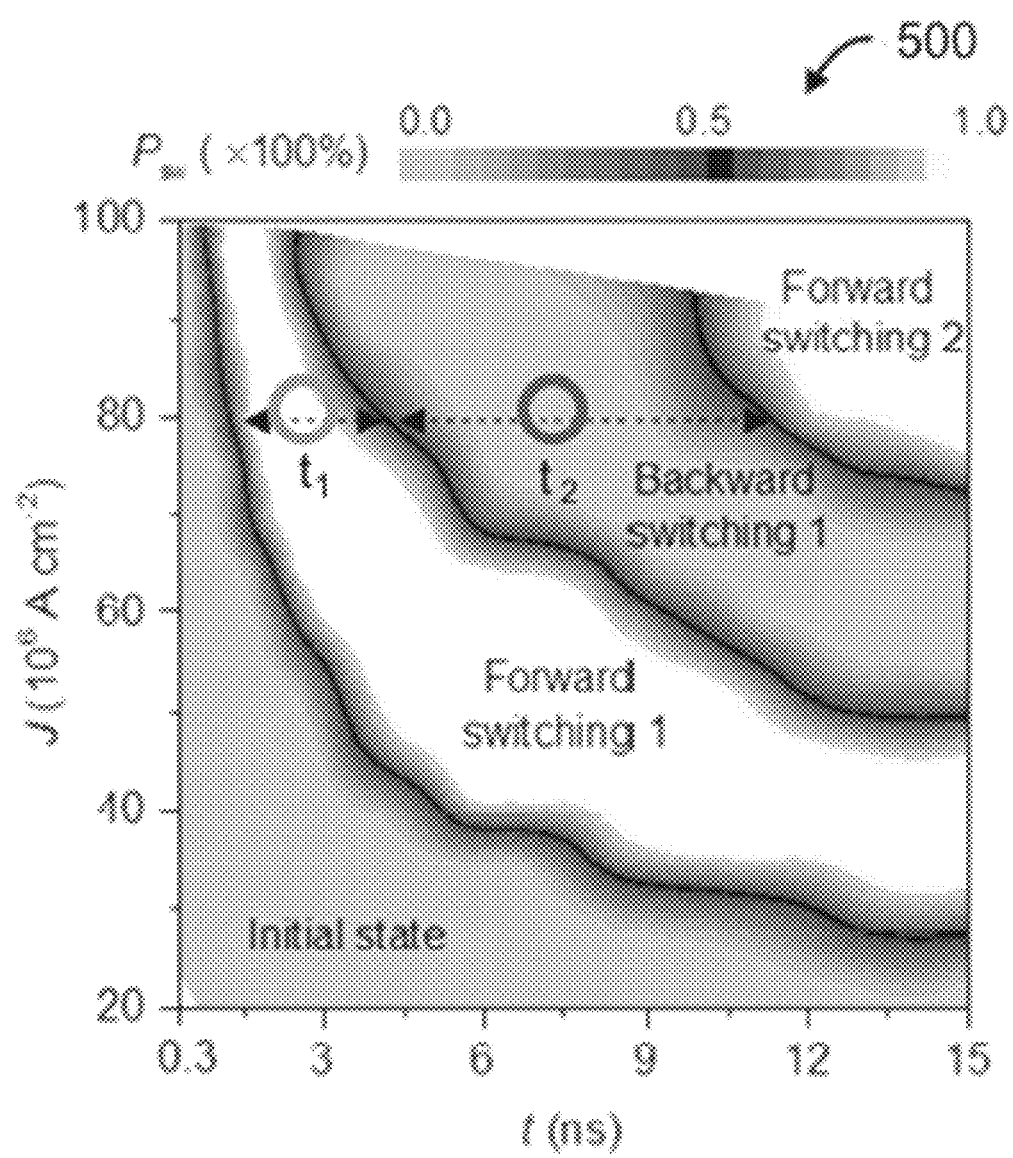
FIG. 5A is a version of the switching probability diagram of FIG. 3, showing selections of a first pulse duration $t_1$ and a second pulse duration $t_2$.
Figure 5B:
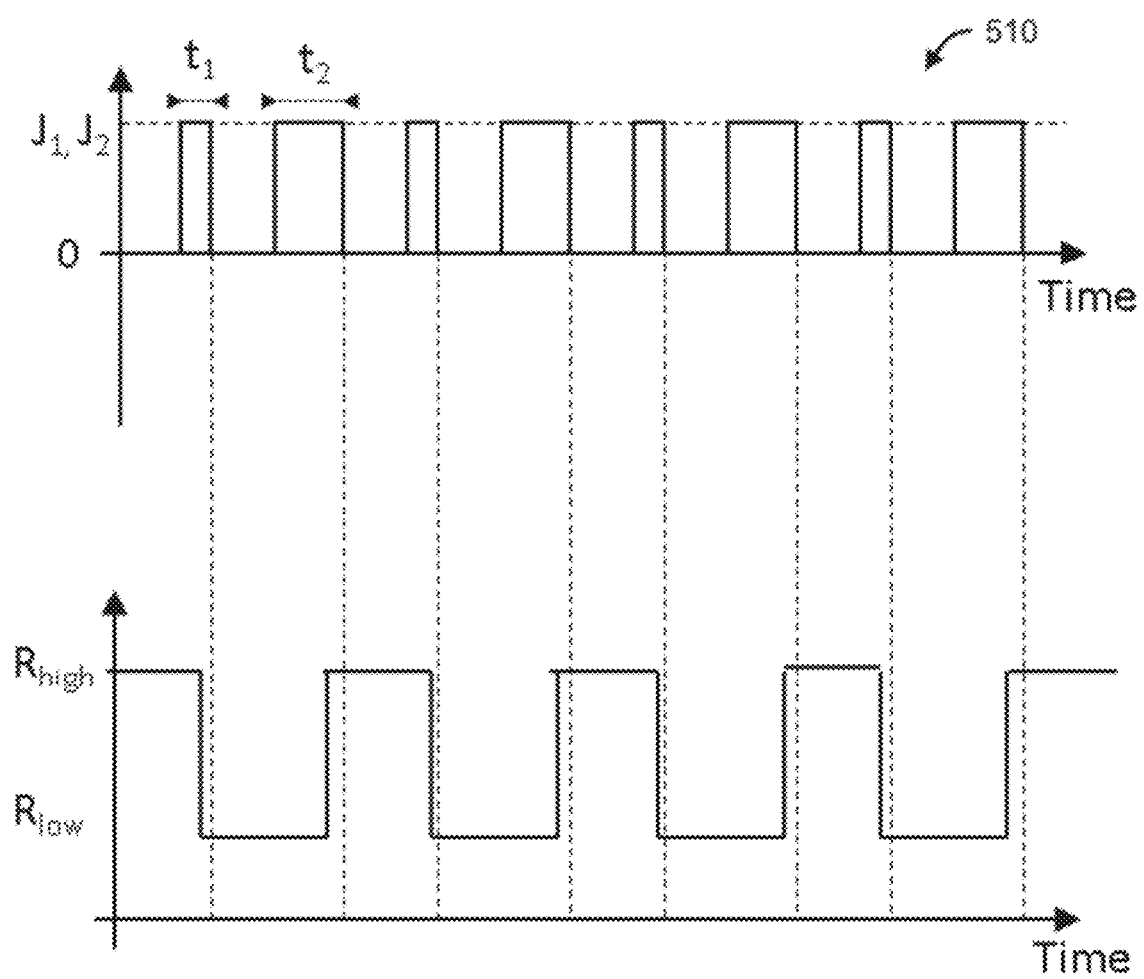
FIG. 5B is a generalized switching diagram showing unipolar currents (a positive current with current density $J_1$ equal to $J_2$) but with differing pulse durations of $t_1$ and $t_2$ and corresponding resistance changes (between a high resistance state $R_{high}$ and a low resistance state $R_{low}$, and vice versa)

Looking first to use of current pulses of differing pulse duration, current pulses with differing durations but fixed current density under a constant in-plane assist field H may be applied to switch between a high resistance state (for example, an "up" magnetization configuration) and a low resistance state (for example, a "down" magnetization configuration, and vice versa. FIG. 5A is a version 500 of the switching probability diagram of FIG. 3, showing selections of a first pulse duration $t_1$ and a second pulse duration $t_2$. FIG. 5B is a generalized switching diagram 510 showing unipolar currents (a positive current with current density $J_1$ equal to $J_2$) but with differing pulse durations of $t_1$ and $t_2$ and corresponding resistance changes (between a high resistance state $R_{high}$ and a low resistance state $R_{low}$, and vice versa). As can be seen, the first pulse duration $t_1$ effectively switches the MTJ from the high resistance state to the low resistance state, while the second pulse duration $t_2$ effectively switches the MTJ from the low resistance state to the high resistance state. The in-plane assist field H is maintained at a fixed polarity and magnitude. FIG. 5B may be compared to FIG. 1 to illustrate differences between unipolar pulse duration controlled switching and bipolar switching.

Figure 5C:
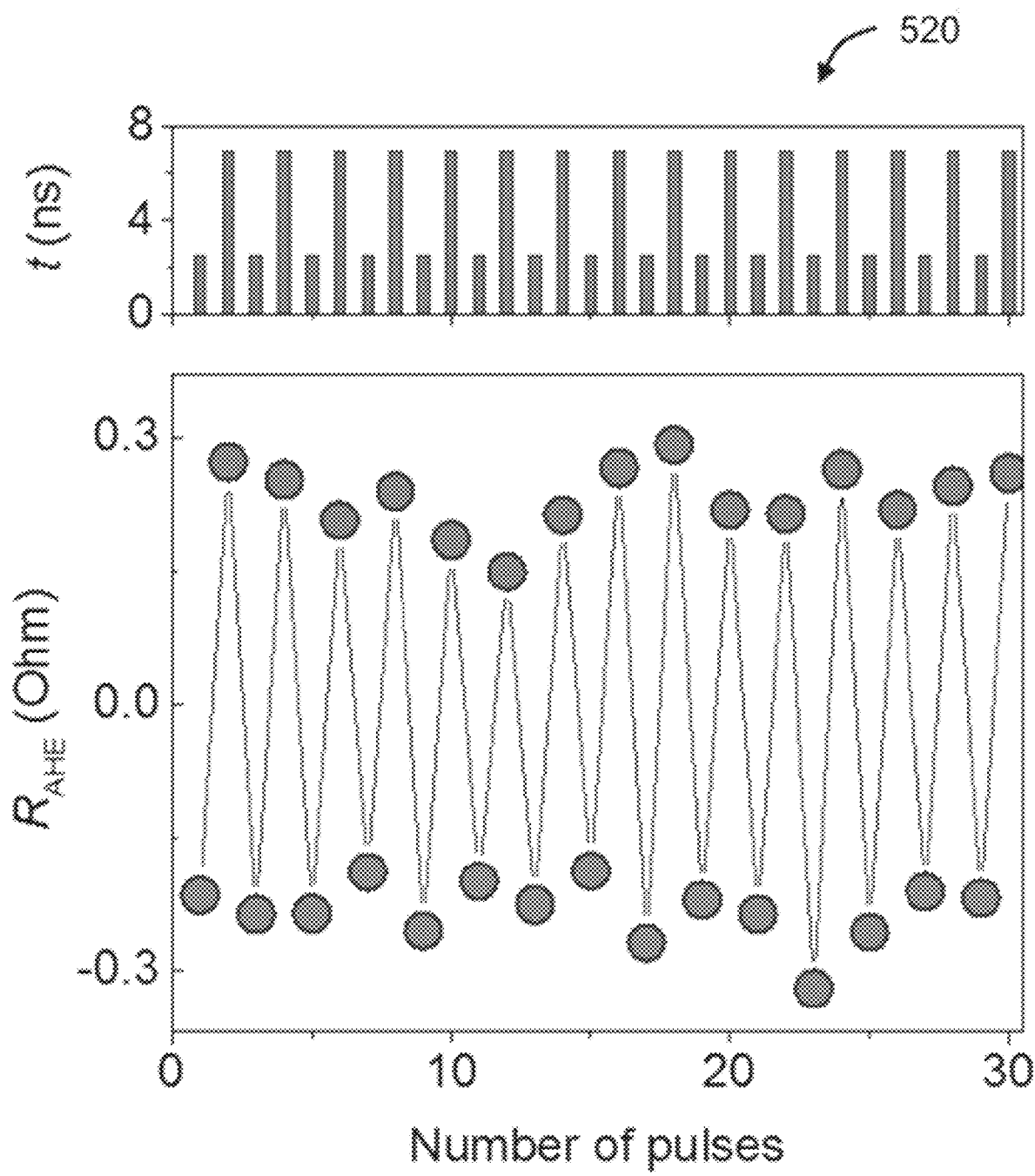
FIG. 5C is a diagram showing anomalous Hall resistance $R_{AHE}$ that indicates the magnetization with "up" and "down" configuration for a series of positive current pulses with alternating lengths with a fixed current density under a constant in-plane assist field H.

For the example SOT device of FIG. 2, specific pulse duration values may be selected. FIG. 5C is a diagram 520 showing anomalous Hall resistance $R_{AHE}$ that indicates magnetization with "up" and "down" configuration for a series of positive current pulses with alternating lengths of 2.5 ns and 7.5 ns with a fixed current density of $+79.4 \times 10^6$ cm$^{-2}$ A (in +x-axis) under a constant in-plane assist field H of 1067 Oe (in the −x-axis). After each pulse injection, the magnetization configuration is monitored using the anomalous Hall resistance ($R_{AHE}$) measurement. As shown in FIG. 5C, deterministic SOT switching consistently occurs as a result of differing pulse duration. The initial configuration of magnetization is pointing "up" and the pulse of 2.5 ns always switches the magnetization to "down" while the magnetization is always brought to the "up" configuration with the pulse of 7.5 ns.

Figure 6A:
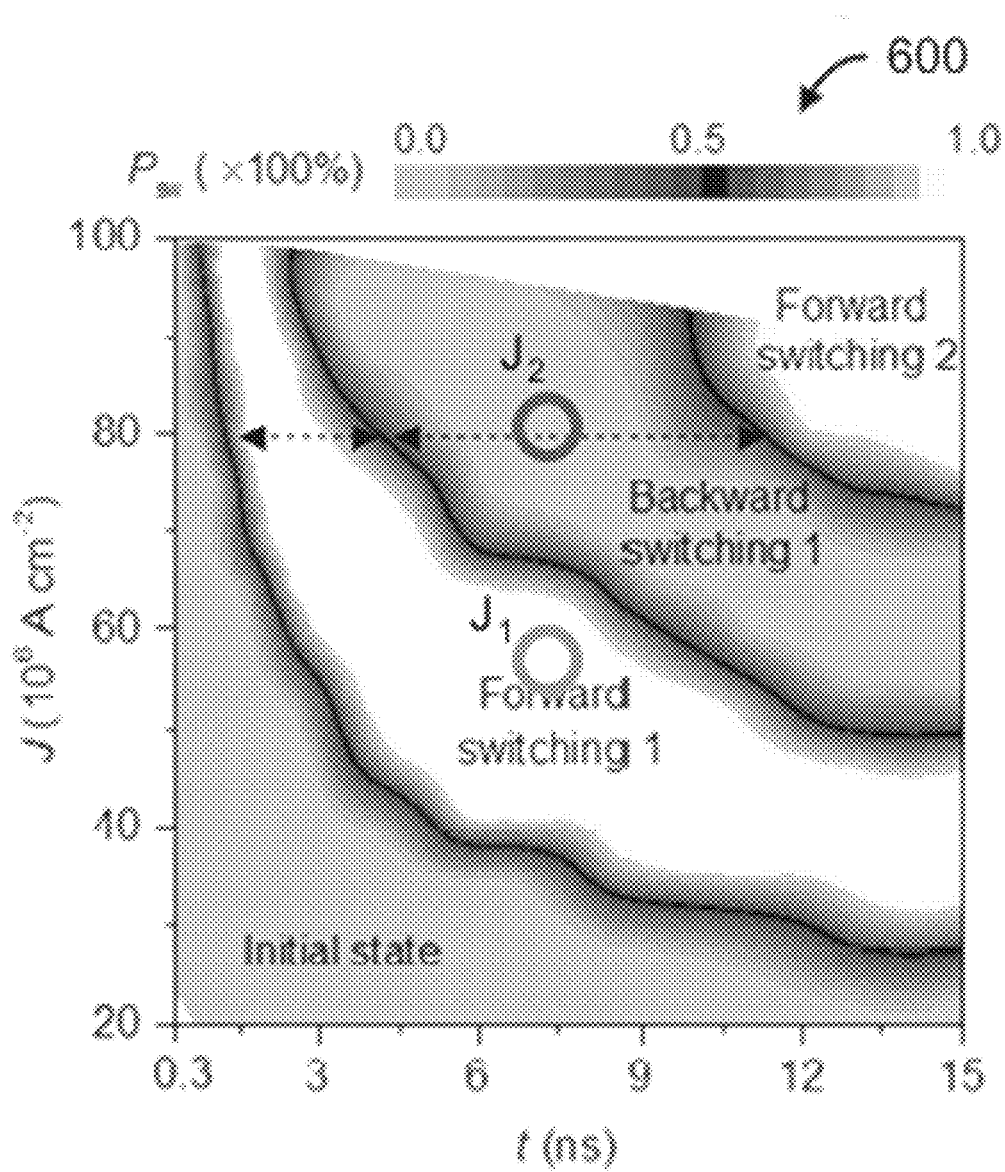
FIG. 6A is a version of the switching probability diagram of FIG. 3, showing selections of a current density $J_1$ and a second current density $J_2$.
Figure 6B:
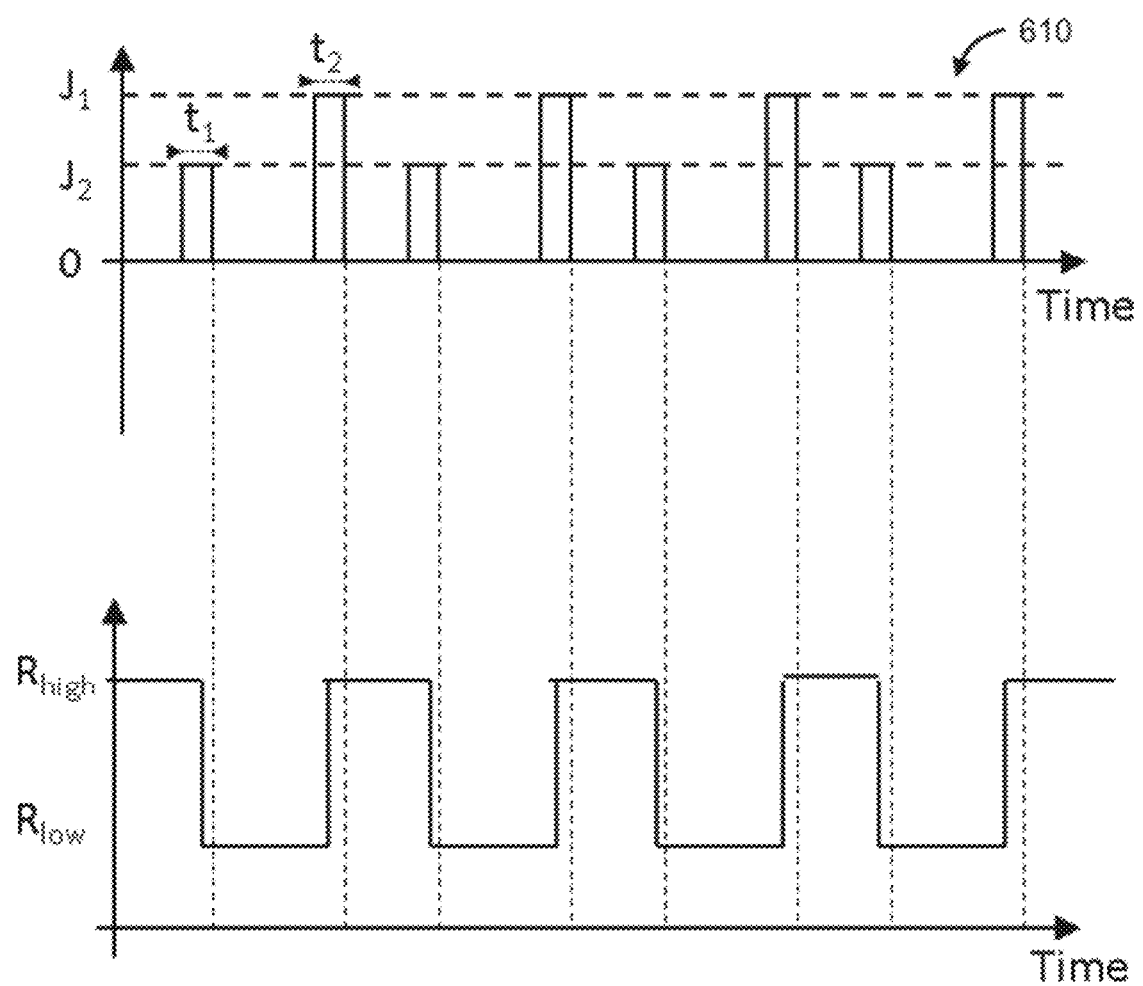
FIG. 6B is a generalized switching diagram showing corresponding resistance changes (between a high resistance state $R_{high}$ and a low resistance state $R_{low}$) for the unipolar current pulses of differing current densities $J_1$ and $J_2$ from FIG. 6A.

Looking next to use of current pulses of differing current density J, current pulses with differing current density J but fixed pulse duration $t_1=t_2$ and a constant in-plane assist field H may be applied to switch between a high resistance state (for example, an "up" magnetization configuration) and a low resistance state (for example, a "down" magnetization configuration. FIG. 6A is a version 600 of the switching probability diagram of FIG. 3, showing selections of a first current density $J_1$ and a second current density $J_2$. FIG. 6B is a generalized switching diagram 610 showing corresponding resistance changes (between a high resistance state $R_{high}$ and a low resistance state $R_{low}$, and vice versa) for the unipolar current pulses of differing current densities $J_1$ and $J_2$ from FIG. 6A. As can be seen, the current density $J_1$ effectively switches the MTJ from the high resistance state to the low resistance state while the current density $J_2$ effectively switches the MTJ from the low resistance state to the high resistance state. The in-plane assist field H is maintained at a fixed polarity and magnitude. FIG. 6B may be compared to FIG. 1 to illustrate differences between unipolar current density controlled switching and bipolar switching.

Physics of SOT Induced Oscillatory Switching Behavior

Figure 7:
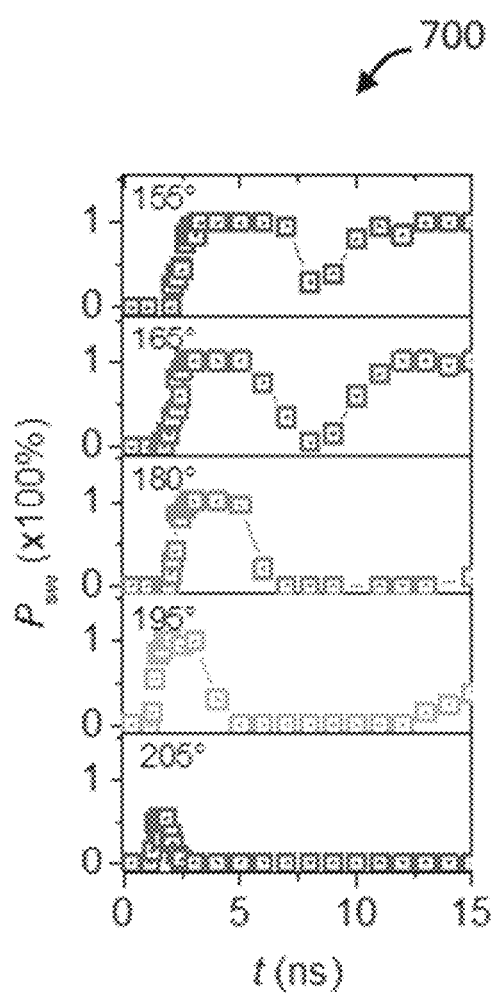
FIG. 7 is a switching probability diagram for the example SOT device of FIG. 2 showing switching probability $P_{sw}$ as a function of pulse duration t with varying in-plane angle $\theta_H$ with current density J and in-plane assist field H fixed.

FLT may play an important role in SOT induced oscillatory switching behavior and the deterministic unipolar SOT switching may be produced utilizing this behavior. Referring to the example SOT device of FIG. 2, switching probability $P_{sw}$ may be measured for different in-plane angle $\theta_H$. FIG. 7 is a switching probability diagram 700 for the example SOT device 200 of FIG. 2 showing switching probability $P_{sw}$ as a function of pulse duration t with varying in-plane angle $\theta_H$ with current density J and in-plane assist field H fixed to $+79.4 \times 10^6$ A cm$^{-2}$ and constant at 1067 Oe, respectively. As can be seen, "down" to "up" backward switching exhibits significant asymmetric behavior with respect to in-plane angle $\theta_H$, compared to "up" to "down" forward switching. The backward switching is suppressed or enhanced as the in-plane assist field H is tilted towards ($\theta_H < 180°$) or away from ($\theta_H > 180°$) the +y-direction. This asymmetric behavior implies that an equivalent field with y-symmetry gives rise to the observed backward switching, and this y-symmetry coincides with the direction of $H_{FLT}$. Harmonic Hall voltage measurements in example SOT device 200 of FIG. 2 show a large $H_{FLT}$ exists in the −y-direction when a positive current (along the +x-direction) is applied. The observed backward switching in FIG. 7 is suppressed when the effective $H_{FLT}$ is reduced by applying an external transverse field along the +y-direction ($\theta_H < 180°$) opposite to the SOT induced $H_{FLT}$ (along the −y-direction). Therefore, it should be understood that contributions of FLT may play a dominant role in breaking the determinism in SOT switching dynamics.

Domain wall velocity $V_{DW}$ may be estimated and compared during the forward and backward switching processes. As the SOT switching occurs by expanding the domain wall in all lateral directions, the $V_{DW}$ during the forward switching can be roughly estimated using the relation, $V_{DW,fwd}=d/(2t_{c,fwd})$, where $t_{c,fwd}$ represents the time corresponding to switching probability $P_{sw}$ equal to 50% during the first forward switching. $V_{DW,fwd}$ may be estimated in the relatively large J regime ($J>J_{c0}$), where the spin-torque is dominant over the thermal activation.

Figure 8:
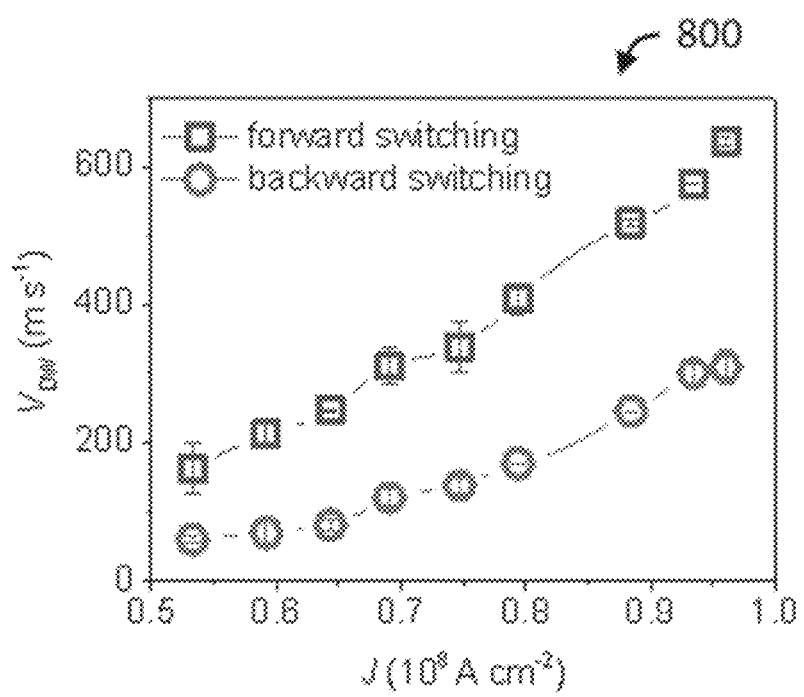
FIG. 8 is a graph of estimated domain wall velocity $V_{DW}$ during forward switching and backward switching with respect to pulse current density J.

FIG. 8 is a graph 800 of estimated domain wall velocity $V_{DW}$ during forward switching and backward switching with respect to pulse current density J. As shown in FIG. 8, the estimated $V_{DW,fwd}$ shows a proportional increase with an increase in current density J, in this example $V_{DW,fwd}$ of 504 m/s for current density J equal to $10^8$ A cm$^{-2}$.

Figure 9:
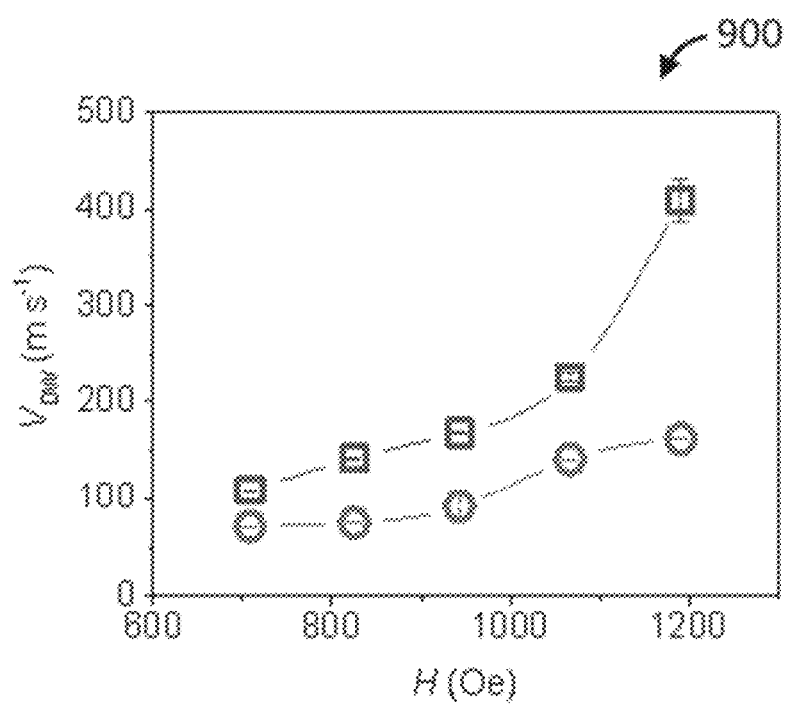
FIG. 9 is a graph of estimated domain wall velocity $V_{DW}$ during forward switching and backward switching with respect to in-plane assist field H.

FIG. 9 is a graph 900 of estimated domain wall velocity $V_{DW}$ during forward switching and backward switching with respect to in-plane assist field H. As can be seen, domain wall velocity $V_{DW}$ increases with increase in magnitude of in-plane assist field H. As H increases, the magnetization at the center of the domain wall ($M_{DW}$) is better aligned towards the H direction (-x direction). Subsequently, the out-of-plane $H_{DLT}$ ($\propto M_{DW} \times \hat{y} \propto$ x-component of $M_{DW}$) exerted on the domain wall also increases leading to a larger $V_{DW}$.

Figure 10:
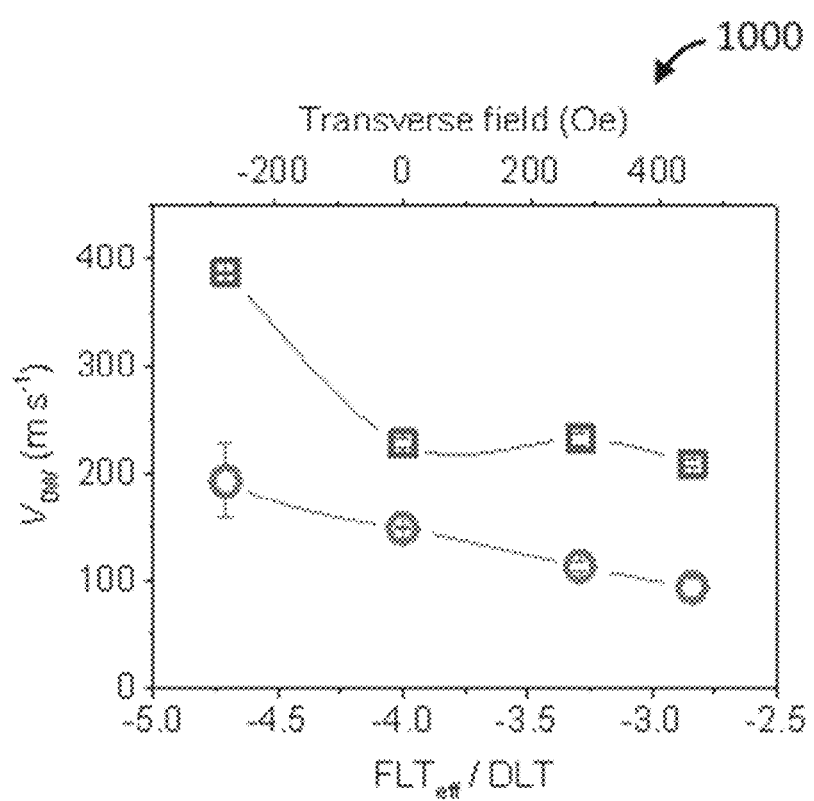
FIG. 10 is a graph of estimated domain wall velocity $V_{DW}$ during forward switching and backward switching with respect to $FLT_{eff}/DLT$ ratio and showing $V_{DW,fwd}$ as a function of the transverse component (y component) of the applied in-plane assist field H.

FIG. 10 is a graph 1000 of estimated domain wall velocity $V_{DW}$ during forward switching and backward switching with respect to $FLT_{eff}/DLT$ ratio and showing $V_{DW,fwd}$ as a function of the transverse component (y component) of the applied in-plane assist field H on the top axis. The asymmetric behavior of $V_{DW,fwd}$ with respect to the transverse component of in-plane assist field H arises due to $M_{DW}$ being pulled away (and the into) the Néel wall configuration resulting in decrease (and then increase) of the $H_{DLT}$ experienced by the domain wall.

Similarly, domain wall velocity $V_{DW}$ during the observed backward switching may be estimated as $V_{DW,bck}=d/2(t_{c,bck}-t_{c,fwd})$, since the backward switching follows the first forward switching in time. The $t_{c,bck}$ represents the time corresponding to switch probability $P_{sw}$ equal to 50% during the backward switching. As can be seen from FIG. 8 and FIG. 9, the estimated $V_{DW,bck}$ also shows monotonic increase with respect to J and H and, and from FIG. 10, an asymmetric behavior as a function of in-plane angle $\theta_H$, implying that the backward switching also arises from the spin torque driven domain expansion, similar to the case of the first forward switching, but in an opposite manner. However, $V_{DW,bck}$ may be smaller than $V_{DW,fwd}$ because the domain expansion in the backward switching is energetically unfavorable as discussed below.

To better understand role of FLT in the oscillatory $P_{sw}$, consider one-dimensional (1D) micromagnetics simulations of the SOT switching driven by domain expansion. Micromagnetic simulations are carried out by numerically solving the below equation including the damping-like and field-like component of spin-orbit torque:

$$\frac{d\hat{m}}{dt} = -\gamma\mu_0 \hat{m} \times \hat{H}_{eff} + \alpha\hat{m} \times \frac{d\hat{m}}{dt} - \gamma\hat{m} \times (-\tau_{DLT}\hat{m} \times \hat{y}) - \gamma\hat{m} \times (-\tau_{FLT}\hat{y}),$$

where $\tau_{DLT}=c_{DLT}(\hbar J)/(2eM_s d)$ and $T_{FLT}=c_{FLT}(\hbar J)/(2eM_s d)$. The equivalent field for each torque terms are defined as $H_{DLT}=-\tau_{DLT}(\hat{m}\times\hat{y})$ and $H_{FLT}=-\tau_{FLT}\hat{y}$. In one example simulation for which the results are discussed below, the following parameters are used: the saturation magnetization $M_s$ is equal to 670 emu/cm$^3$, the perpendicular anisotropy K is equal to $3.83\times10^6$ erg/cm$^3$, the exchange stiffness constant $A_{ex}$ is equal to $2.0\times10^{-6}$ erg/cm, the damping a is equal to 0.07, the DLT efficiency $c_{DLT}$ is equal to -0.1, and the FLT efficiency $c_{FLT}$ is equal to +0.4. In this example, for the current pulse, both the rise and fall times are 100 ps, and by sign convention, a negative DLT efficiency ($c_{DLT}<0$) induces an up-to-down switching for $J>0$ and $H_x<0$. The sample dimension may be 500 nm×80 nm×2 nm and the unit cell size may be 2 nm×80 nm×2 nm.

Figure 11:
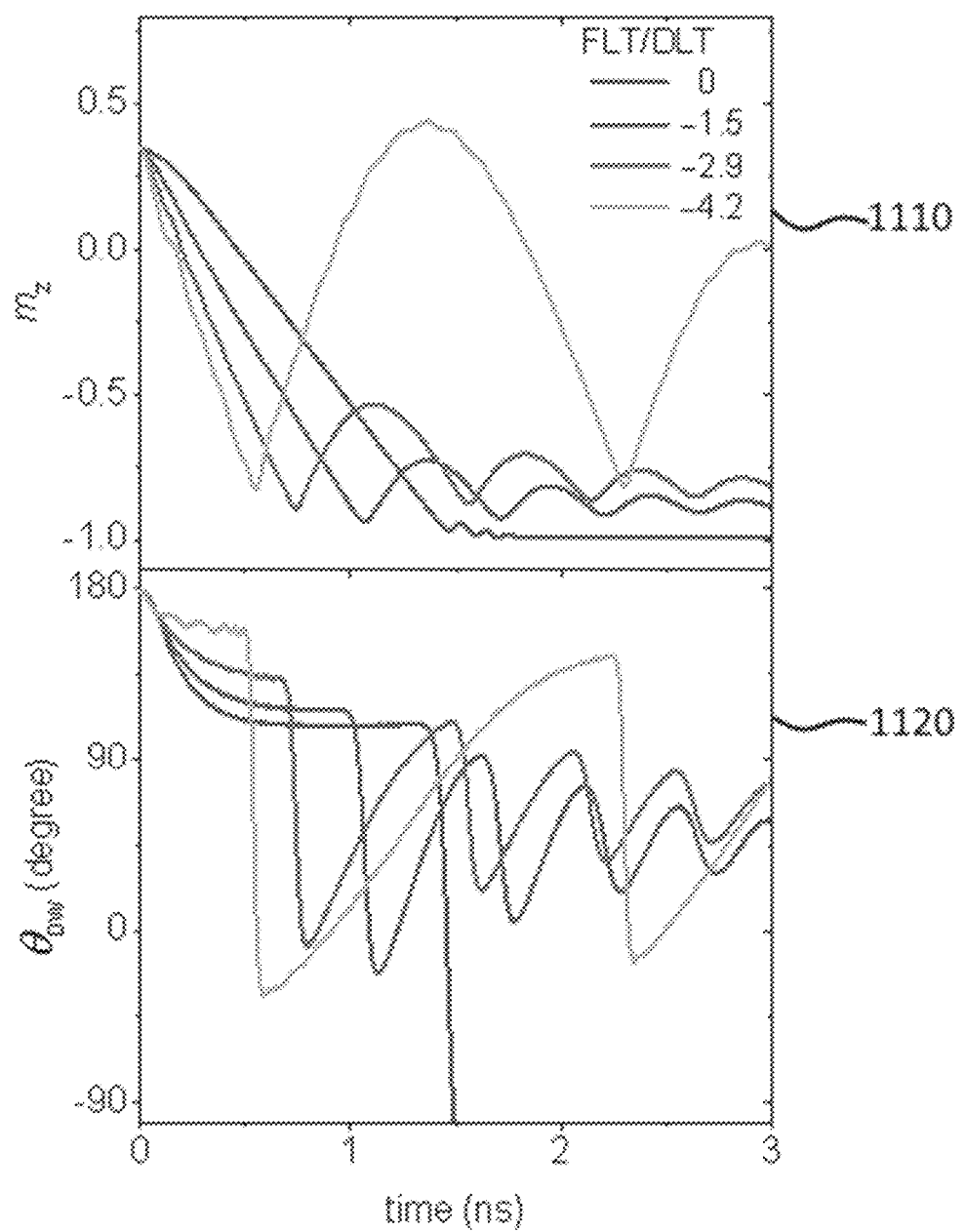
FIG. 11 is a pair of temporal evolutions, in the top panel of out-of-plane magnetization $m_z$, and in the bottom panel of domain wall angle $\theta_{DW}$, under spin-orbit torque from 1D simulation.

FIG. 11 is a pair of temporal evolutions, in the top panel 1110 of out-of-plane magnetization $m_z$, and in the bottom panel 1120 of domain wall angle $\theta_{DW}$ under spin-orbit torque from 1D simulation. The azimuthal angle of $M_{DW}$, referred to as $\theta_{DW}$, is the defined with respect to the +x-axis. The top panel 1110 shows the SOT induced temporal evolution of averaged out-of-plane magnetization $m_z$ as a function of the FLT/DLT ratio, where the value of DLT is kept constant. At the start of the simulation (at time equal to 0 ns), a reversed "down" domain is introduced at one edge of the structure. This reversed domain is then expanded by SOT as the simulation proceeds (for time >0 ns). In the case where there is no FLT, the SOT successfully switches the magnetization to "down" ($m_z=-1$) state. However, when a large FLT is considered (FLT/DLT=-4.2), the 1D simulation also reproduces the backward switching behavior as the $m_z$ returns back to a positive value after the forward switching. This backward switching behavior is gradually suppressed with decreasing the magnitude of the FLT/DLT ratio.

The bottom panel 1120 of FIG. 11 shows the temporal evolutions of azimuthal angle of the domain wall $\theta_{DW}$, which is the angle between $M_{DW}$ and +x-direction. The evolution of $\theta_{DW}$ for the different ratios of FLT/DLT indicates the key role of FLT on the domain expansion in the opposite direction and the resultant backward switching. At the start of simulation, due to the applied H, the x-component of $M_{DW}$ is along the -x-direction and thus $\theta_{DW}$ is equal to 180°. Under the application of SOT, the reversed domain expands and $\theta_{DW}$ gradually decreases to 90° as $M_{DW}$ damps towards the spin polarization direction. For the case without FLT (FLT/DLT=0), the domain wall annihilates as it expands to the structure edge ($m_z=-1$) which results in $M_{DW}$ and thus °DW not being well defined. However, when a sizeable FLT of opposite sign to DLT is considered, $\theta_{DW}$ exhibits an oscillatory behavior over time, which indicates that the domain wall does not immediately annihilate after it reaches the structure edge. Further, it is observed that the time for which $|\theta_{DW}|$ is stable below 90° increases with increasing the magnitude of FLT, whenever the value of $|\theta_{DW}|<90°$ ($M_{DW}$ in +x-direction), the SOT drives the backward switching. This result indicates that the FLT facilitates backward switching by stabilizing $|\theta_{DW}|<90°$.

Figure 12:
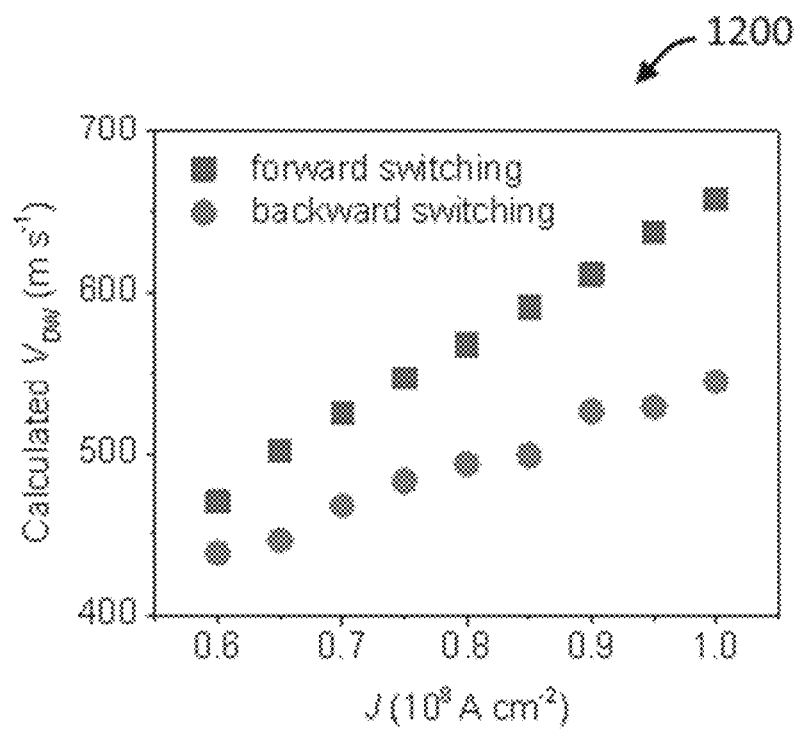
FIG. 12 is a graph of calculated domain wall velocity $V_{DW}$ during forward switching and backward switching with respect to pulse current density J, for comparison with FIG. 8.
Figure 13:
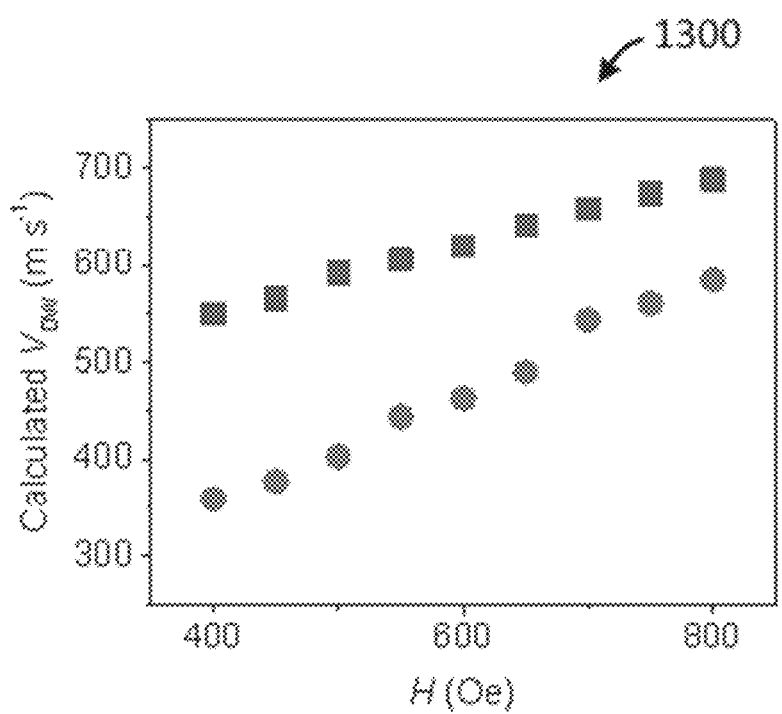
FIG. 13 is a graph of calculated domain wall velocity $V_{DW}$ during forward switching and backward switching with respect to in-plane assist field H, for comparison with FIG. 9.
Figure 14:
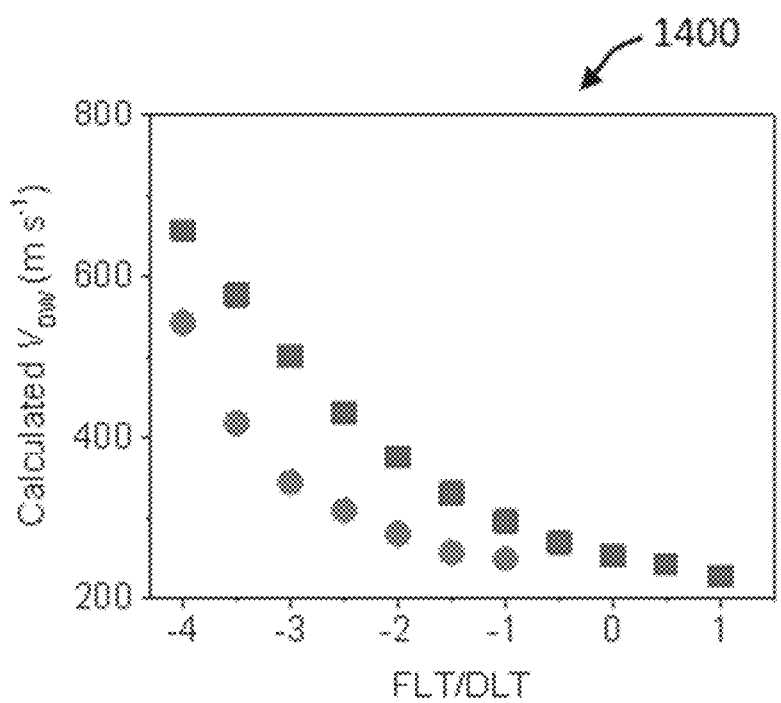
FIG. 14 is a graph of calculated domain wall velocity $V_{DW}$ during forward switching and backward switching with respect to $FLT_{eff}/DLT$ ratio for comparison with FIG. 10.

FIG. 12 is a graph 1200 of calculated domain wall velocity $V_{DW}$ during forward switching and backward switching with respect to pulse current density J, for comparison with FIG. 8. FIG. 13 is a graph 1300 of calculated domain wall velocity $V_{DW}$ during forward switching and backward switching with respect to in-plane assist field H, for comparison with FIG. 9. Likewise, FIG. 14 is a graph 1400 of calculated domain wall velocity $V_{DW}$ during forward switching and backward switching with respect to $FLT_{eff}/DLT$ ratio for comparison with FIG. 10. The calculated and estimated $V_{DW}$ show good qualitative agreement as the monotonic behavior with respect to H and J, asymmetric behavior with respect to the FLT/DLT ratio and the slower velocity during backward switching is reproduced.

Figure 15:
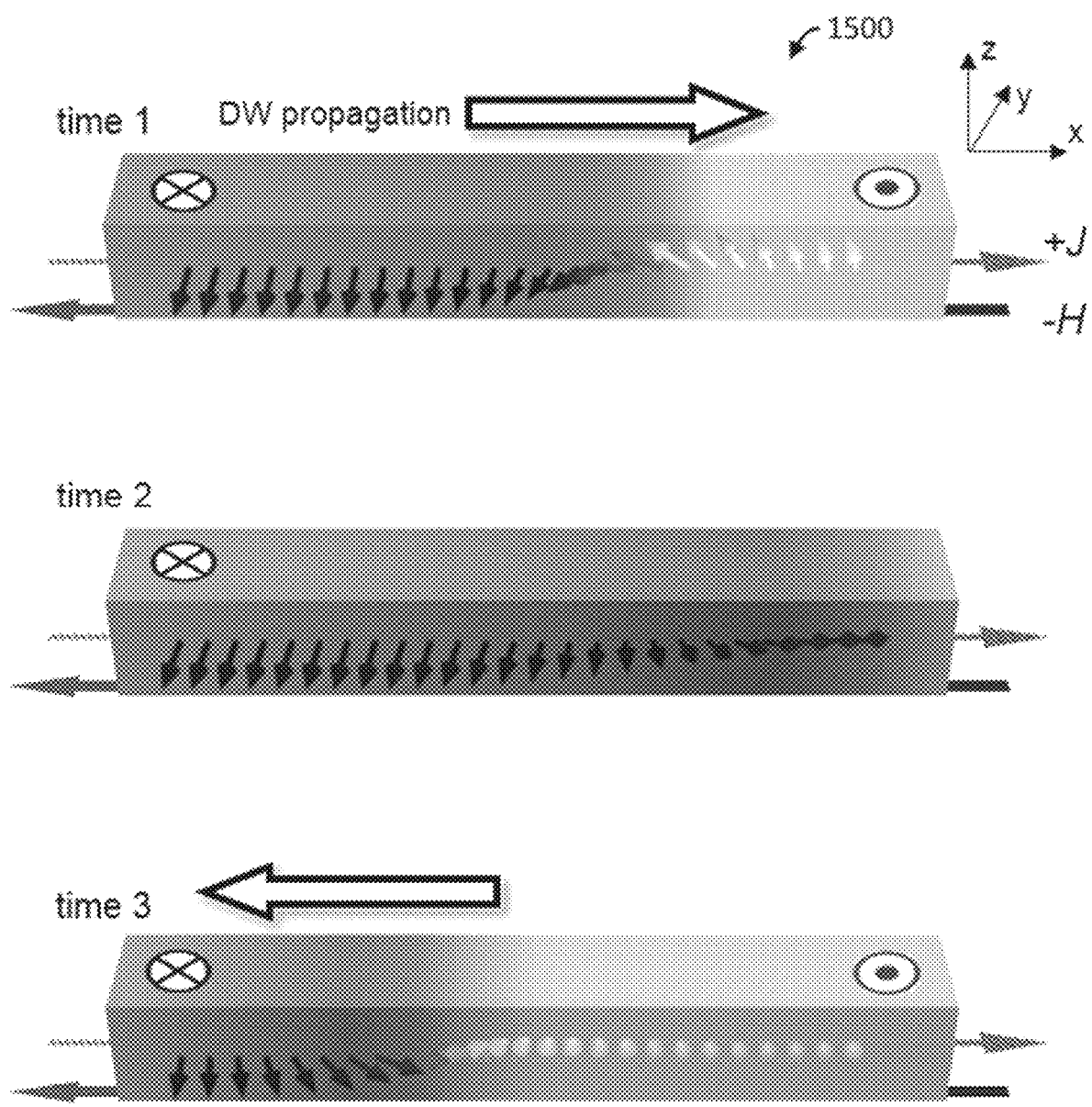
FIG. 15 is a diagram of domain wall configuration at times 1-3 during the SOT switching process.
Figure 16:
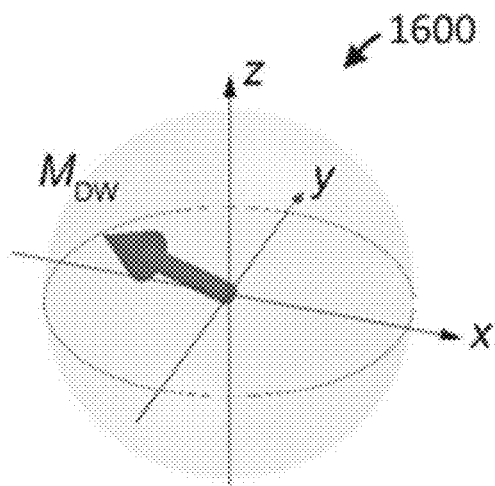
FIG. 16 is a diagram of the magnetization at the center of the domain wall, $M_{DW}$ orientation at times 1-3 during the SOT switching process.
Figure 16:
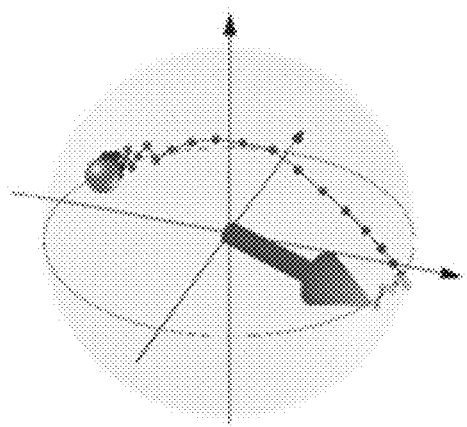
Figure 16:
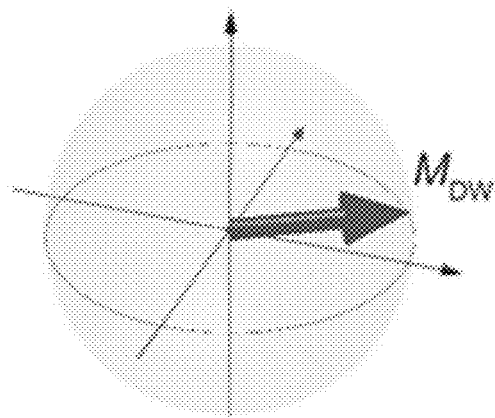
Figure 17:
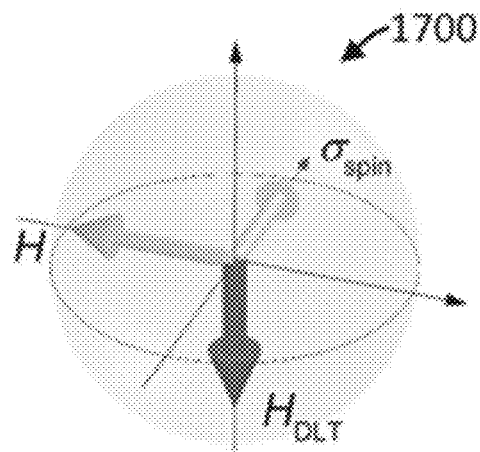
FIG. 17 is a diagram of torques acting on $M_{DW}$ at times 1-3 during the SOT switching process.
Figure 17:
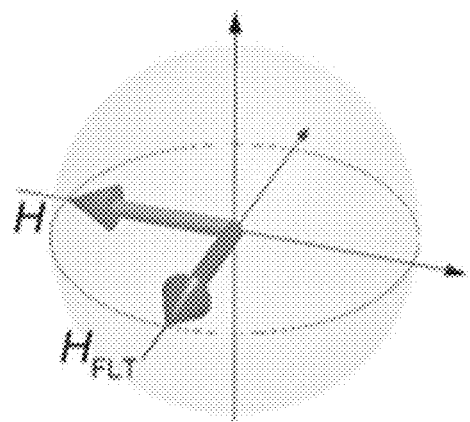
Figure 17:
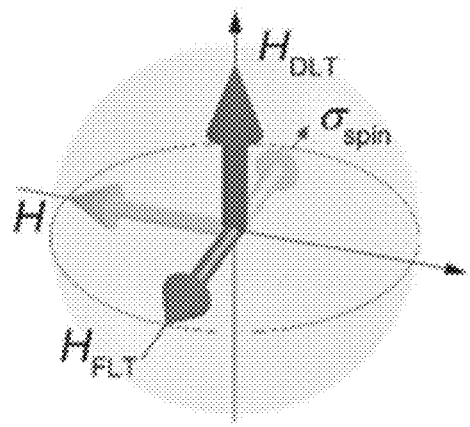

The physics behind the FLT induced oscillatory behavior of $\theta_{DW}$ and the resultant backward switching is illustrated in FIGS. 15-17. Specifically, FIG. 15 is a diagram 1500 of domain wall configuration at times 1-3 during the SOT switching process. FIG. 16 is a diagram 1600 of the magnetization at the center of the domain wall, $M_{DW}$ orientation at times 1-3 during the SOT switching process. Further, FIG. 17 is a diagram 1700 of torques acting on $M_{DW}$ at times 1-3 during the SOT switching process. Time 1 corresponds to the case of "up" to "down" forward switching process during when the x-component of $M_{DW}$ is stabilized along x-direction ($M_{DW}\cdot\hat{x}<0$). Consequently, the domain wall experiences an out-of-plane $H_{DLT}$ in the −z-direction ($M_{DW}\times\hat{y}<0$) and the "down" domain expands to advance the switching process. Time 2 corresponds to the case when the propagating domain wall reaches the structure edge and annihilates. However, this annihilation process is followed by a nucleation of a domain wall with an inverted chirality ($M_{DW}\cdot\hat{x}>0$) which can be understood as a reflection of the domain wall on the structure edge. This domain wall with an inverted chirality is not energetically favorable and follows damped motion over time to revert back its chirality due to the applied H along the −x-direction. However, a sufficiently large $H_{FLT}$ in the −y-direction can give dynamic stability to the domain wall with inverted chirality with a lifetime of several nanoseconds. Time 3 corresponds to the case of "down" to "up" backward switching follows the forward switching in time as $H_{DLT}$ acting on domain wall ($M_{DW}\cdot\hat{x}>0$) expands the "up" domain. As this metastable DW's center is along the +x-direction, it experiences a $H_{DLT}$ in the +z-direction ($M_{DW}\times\hat{y}>0$), therefore the "up" domain expands, which results in the backward switching. Over time, the metastable domain wall recovers back its chirality with its $M_{DW}$ again pointing back to the −x-direction which proceeds to switch the magnetization again in the forward direction and the whole cycle repeats giving rise to the oscillatory behavior in $P_{sw}$. The velocities of the two switching processes are different since the inverted domain wall configuration during the backward switching is in an energetically unfavorable state as the applied external H is against $M_{DW}$. Furthermore, the attained metastability of the reversed domain wall decreases over time and eventually only the forward switching will prevail. As a result, backward switching is observed in the nanosecond time scale.

In conclusion, the above disclosure describes an SOT induced oscillatory switching behavior that may be taken advantage of to achieve deterministic unipolar SOT switching. FLT may play an important role in the unipolar SOT switching. Example methods are provided for unipolar SOT switching from FLT of a magnetic memory, such as a MRAM, using current pulses with a fixed polarity and assist-field with a fixed polarity but differing pulse durations or pulse current densities. Example diode-controlled magnetic memory devices, such as MRAMs, are described that include one or more diodes configured to apply such currents pulses.

It should be understood that various adaptations and modifications may be made to the above discussed techniques. In general, it should be appreciated that details included in the various example embodiments are merely provided for purposes of illustration, and are not intended to limit the scope, applicability, or configuration of the invention. For example, it should be understood that the various elements described above may be made from differing materials, implemented in different combinations or otherwise formed or used differently without departing from the intended scope of the invention.

What is claimed is:

1. A method for unipolar spin-orbit-torque (SOT) switching of a magnetic memory having an electrical current channel in a plane adjacent to a magnetic tunnel junction (MTJ), comprising:
   applying an in-plane assist field having a fixed polarity; and
   applying in-plane current pulses having different pulse durations to switch the MTJ via SOT, wherein an in-plane current pulse having a first pulse duration is applied to switch the MTJ from a first resistance state to a second resistance state that has a lower electrical resistance than the first resistance state, and an in-plane current pulse having a second pulse duration is applied to switch the MTJ from the second resistance state to a first resistance state, with the second pulse duration being different than the first pulse duration.

2. The method of claim 1, wherein the in-plane current pulses have constant current density.

3. The method of claim 1, wherein the second pulse duration is longer than the first pulse duration.

4. The method of claim 1, wherein the MTJ is switched via SOT at least in part from field-like torque (FLT).

5. The method of claim 1, wherein the in-plane assist field also has a fixed magnitude.

6. A method for unipolar spin-orbit-torque (SOT) switching of a magnetic memory having an electrical current channel in a plane adjacent to a magnetic tunnel junction (MTJ), comprising:
   applying an in-plane assist field having a fixed polarity; and
   applying in-plane current pulses having different current densities to switch the MTJ via SOT, wherein an in-plane current pulse having a first current density is applied to switch the MTJ from a first resistance state to a second resistance state that has a lower electrical resistance than the first resistance state, and an in-plane current pulse having a second current density is applied to switch the MTJ from the second resistance state to a first resistance state, with the second current density being different than the first current density.

7. The method of claim 6, wherein the in-plane current pulses have constant pulse duration.

8. The method of claim 6, wherein the second current density is larger than the first current density.

9. The method of claim 6, wherein the MTJ is switched via SOT at least in part from field-like torque (FLT).

10. The method of claim 6, wherein the in-plane assist field also has a fixed magnitude.

11. A magnetic memory, comprising
   a magnetic tunnel junction (MTJ);
   a current channel disposed in a plane adjacent to the MTJ; and
   one or more diodes configured to apply in-plane current pulses having a first pulse duration or first current density to switch the MTJ via spin-orbit-torque (SOT) from a first resistance state to a second resistance state that has a lower electrical resistance than the first resistance state, and to apply an in-plane current pulse having a second pulse duration or a second current density to switch the MTJ from the second resistance state to the first resistance state, the second pulse duration or the second current density being different than the first pulse duration or the first current density, respectively.

12. The magnetic memory of claim 11, wherein the one or more diodes are configured to apply in-plane current pulses having first and second pulse durations.

13. The magnetic memory of claim 12, wherein the second pulse duration is longer than the first pulse duration.

14. The magnetic memory of claim 12, wherein a current density of the in-plane current pulses is constant.

15. The magnetic memory of claim 11, wherein the one or more diodes are configured to apply in-plane current pulses having first and second current densities.

16. The magnetic memory of claim 15, wherein the second current density is larger than the first second current density.

17. The magnetic memory of claim 15, wherein a pulse duration of the in-plane current pulses is constant.

18. The magnetic memory of claim 11, wherein the MTJ is switched via SOT at least in part from field-like torque (FLT).

19. The magnetic memory of claim 11, wherein the magnetic memory is a diode-controlled magnetic random access memory (MRAM).

20. The magnetic memory of claim 11, wherein the MTJ comprises a free magnetic layer, a tunneling barrier layer, and a reference magnetic layer, and wherein the first resistance state and the second resistance state are caused by a relative alignment of the magnetization of the free magnetic layer and the reference magnetic layer.

* * * * *